(12) United States Patent
Liu et al.

(10) Patent No.: US 12,349,578 B2
(45) Date of Patent: Jul. 1, 2025

(54) ORGANIC LIGHT EMITTING DISPLAY PANEL, METHOD FOR MANUFACTURING THE SAME, AND DISPLAY DEVICE

(71) Applicant: BOE Technology Group Co., Ltd., Beijing (CN)

(72) Inventors: Ming Liu, Beijing (CN); Qiuhua Meng, Beijing (CN); Linqian Han, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 172 days.

(21) Appl. No.: 17/403,340

(22) Filed: Aug. 16, 2021

(65) Prior Publication Data

US 2022/0102448 A1  Mar. 31, 2022

(30) Foreign Application Priority Data

Sep. 29, 2020 (CN) .......................... 202011053111.0

(51) Int. Cl.
*H10K 59/80* (2023.01)
*H10K 50/84* (2023.01)
(Continued)

(52) U.S. Cl.
CPC ....... *H10K 59/80522* (2023.02); *H10K 50/84* (2023.02); *H10K 50/865* (2023.02);
(Continued)

(58) Field of Classification Search
CPC ............ H01L 21/0276; H01L 27/3246; H01L 27/3283; H01L 27/3295; H01L 27/3272;
(Continued)

(56) References Cited

U.S. PATENT DOCUMENTS 9,679,952 B2 * 6/2017 Miyazawa ......... H10K 59/1315
2002/0014836 A1 * 2/2002 Codama ............... H10K 50/814
313/506
(Continued)

FOREIGN PATENT DOCUMENTS

CN 110212007 A 9/2019
CN 109742122 B 8/2021

OTHER PUBLICATIONS

Szekeres et al, Spectroscopic ellipsometry study of CVD molybdenum oxide films: effect of temperature, May 16, 2002, J. Solid State Electrochem, vol. 7 pp. 17-20. (Year: 2002).*
Guogang et al, Preparation Methods and Application of Silicon Oxide Films, 2014, Atlantis Press, p. 479-483 (Year: 2014).*

*Primary Examiner* — Vu A Vu
*Assistant Examiner* — Valerie N Newton
(74) *Attorney, Agent, or Firm* — IPro, PLLC

(57) ABSTRACT

An organic light emitting display panel includes a substrate having one or more organic light emitting diodes thereon; a pixel definition layer, wherein the pixel definition layer defines one or more sub-pixel regions on the substrate; a metal layer, wherein the metal layer is located on one side of the pixel definition layer away from the substrate; an anti-reflection layer, wherein the anti-reflection layer is located on one side of the metal layer away from the pixel definition layer, and the orthographic projection of the metal layer on the substrate is located within the range where the orthographic projection of the anti-reflection layer on the substrate is located; a light emitting layer, wherein the light emitting layer is located on one side of the anti-reflection layer away from the metal layer; and a cathode, wherein the cathode is located on one side of the light emitting layer away from the anti-reflection layer, and the cathode is connected to the metal layer in a roundabout manner.

19 Claims, 2 Drawing Sheets

(51) Int. Cl.
*H10K 50/86* (2023.01)
*H10K 59/122* (2023.01)
*H10K 71/00* (2023.01)
H10K 102/00 (2023.01)

(52) U.S. Cl.
CPC ......... *H10K 59/122* (2023.02); *H10K 59/879* (2023.02); *H10K 71/00* (2023.02); *H10K 59/87* (2023.02); *H10K 59/8792* (2023.02); *H10K 2102/00* (2023.02)

(58) Field of Classification Search
CPC ............ H01L 51/5209; H01L 51/5225; H10K 59/122; H10K 50/865; H10K 71/00
See application file for complete search history.

(56) References Cited

U.S. PATENT DOCUMENTS

| | | | |
|---|---|---|---|
| 2012/0217516 A1* | 8/2012 | Hatano | H10K 59/122 |
| | | | 257/E33.062 |
| 2016/0233458 A1* | 8/2016 | Shen | H10K 59/35 |
| 2017/0062755 A1* | 3/2017 | Im | H10K 50/828 |
| 2018/0375057 A1* | 12/2018 | Shin | H10K 71/621 |
| 2019/0173032 A1* | 6/2019 | Park | H10K 30/81 |
| 2020/0058895 A1* | 2/2020 | Wang | H10K 59/121 |
| 2020/0343315 A1* | 10/2020 | Lin | H10K 59/126 |
| 2022/0077257 A1* | 3/2022 | Choung | H10K 59/173 |
| 2022/0093894 A1* | 3/2022 | Song | H10K 59/1315 |

\* cited by examiner

ORGANIC LIGHT EMITTING DISPLAY PANEL, METHOD FOR MANUFACTURING THE SAME, AND DISPLAY DEVICE

CROSS-REFERENCE TO RELATED APPLICATIONS

The present application claims priority to Chinese Patent Application No. 202011053111.0 filed in China on Sep. 29, 2020, which is incorporated herein by reference in its entirety.

TECHNICAL FIELD

The present disclosure relates to the field of displays, and particularly to an organic light emitting display panels, a method for manufacturing the organic light emitting display panels, and a display device.

BACKGROUND

Organic Light Emitting Diode (OLED) is a new display technology since the mid-20th century, the OLED has been increasingly used in high-performance displays as a current-mode light emitting device. However, the existing OLED display panels easily have problems such as screen reflection and glare during use, which cannot meet the requirements in daily use. In addition, the existing OLED display panels easily have problem of non-uniform display brightness in different regions of a screen.

Therefore, the present organic light emitting display panel, the method for manufacturing the organic light emitting display panel, and the display device still need to be further improved.

SUMMARY

In a first aspect, embodiments of the present disclosure provide an organic light emitting display panel which includes: a substrate having one or more organic light emitting diodes thereon; a pixel definition layer which defines one or more sub-pixel regions on the substrate; a metal layer which is located on one side of the pixel definition layer away from the substrate; an anti-reflection layer, which is located on one side of the metal layer away from the pixel definition layer, and the orthographic projection of the metal layer on the substrate is located within the range where the orthographic projection of the anti-reflection layer on the substrate is located; a light emitting layer, which is located on one side of the anti-reflection layer away from the metal layer; and a cathode, which is located on one side of the light emitting layer away from the anti-reflection layer, and the cathode is connected to the metal layer in a roundabout manner.

According to one possible embodiment of the present disclosure, the cathode is connected to the metal layer in a roundabout manner, that is, the cathode extends in a direction substantially perpendicular to the direction of extension of the substrate and in a direction substantially parallel to the direction of extension of the substrate in order to be in contact with the metal layer.

According to one possible embodiment of the present disclosure, the metal layer has an inwardly retracted structure on both sides in a direction substantially parallel to the extension direction of the substrate.

According to one possible embodiment of the present disclosure, the metal layer has the inwardly retracted structure on only one side in the direction substantially parallel to the extension direction of the substrate.

According to one possible embodiment of the present disclosure, the inwardly retracted structure of the metal layer has an internal core pulling rectangular shape.

According to one possible embodiment of the present disclosure, the light emitting layer covers a surface of the anti-reflection layer, sidewalls of the pixel definition layer and the sub-pixel regions.

According to one possible embodiment of the present disclosure, the refractive index of the material of the anti-reflection layer is between 2 and 3 and the extinction coefficient of the material of the anti-reflection layer is between 0 and 1.

According to one possible embodiment of the present disclosure, the refractive index of the material of the anti-reflection layer is about 2.5 and the extinction coefficient of the material of the anti-reflection layer is about 0.5.

According to one possible embodiment of the present disclosure, the material of the metal layer is a metal.

According to one possible embodiment of the present disclosure, the material of the metal layer includes at least one of molybdenum and aluminum.

According to one possible embodiment of the present disclosure, the material of the anti-reflection layer includes at least one of molybdenum oxide, niobium oxide and copper oxide.

According to one possible embodiment of the present disclosure, the minimum distance between the edge of the orthographic projection of the metal layer on the substrate and the edge of the orthographic projection of the anti-reflection layer on the substrate is between 0.5 and 1.5 micrometer.

According to one possible embodiment of the present disclosure, the minimum distance between the edge of the orthographic projection of the metal layer on the substrate and the edge of the orthographic projection of the anti-reflection layer on the substrate is about 1 micrometer.

According to one possible embodiment of the present disclosure, the organic light emitting display panel further includes an encapsulation structure and a color resistance structure which is located on one side of the encapsulation structure away from the substrate.

According to one possible embodiment of the present disclosure, the color resistance structure includes a black matrix and color resistance blocks.

In a second aspect, embodiments of the present disclosure also provide a method for manufacturing an organic light emitting display panel which includes: forming the pixel definition layer on one side of the substrate; forming the metal layer on one side of the pixel definition layer away from the substrate; forming the anti-reflection layer on one side of the metal layer away from the pixel definition layer; forming the light emitting layer on one side of the anti-reflection layer away from the metal layer; and forming the cathode on one side of the light emitting layer away from the anti-reflection layer. Specifically, the cathode is located on one side of the light emitting layer away from the anti-reflection layer, and the cathode is connected to the metal layer in a roundabout manner.

According to one possible embodiment of the disclosure, the method further includes: etching the metal layer with an etching gas after forming the anti-reflection layer so that the orthographic projection of the metal layer on the substrate is within the range of the orthographic projection of the anti-reflection layer on the substrate.

According to one possible embodiment of the present disclosure, when the material of the metal layer is aluminum, the etching gas is chlorine gas.

According to one possible embodiment of the present disclosure, when the material of the metal layer is molybdenum, the etching gas is sulfur hexafluoride and oxygen.

In a third aspect, embodiments of the present disclosure also provide a display device including a display panel. And the organic light emitting display panel includes: a substrate having one or more organic light emitting diodes thereon; a pixel definition layer, wherein the pixel definition layer defines one or more sub-pixel regions on the substrate; a metal layer, wherein the metal layer is located on one side of the pixel definition layer away from the substrate; an anti-reflection layer, wherein the anti-reflection layer is located on one side of the metal layer away from the pixel definition layer, and the orthographic projection of the metal layer on the substrate is located within the range where the orthographic projection of the anti-reflection layer on the substrate is located; a light emitting layer, wherein the light emitting layer is located on one side of the anti-reflection layer away from the metal layer; and a cathode. Specifically the cathode is located on one side of the light emitting layer away from the anti-reflection layer, and the cathode is connected to the metal layer in a roundabout manner.

BRIEF DESCRIPTION OF THE DRAWINGS

The foregoing and/or additional aspects and advantages of the present disclosure will become apparent and readily appreciated from the following description of embodiments in conjunction with the accompanying drawings, wherein.

DESCRIPTION OF NUMBERS IN THE ACCOMPANY DRAWINGS

Figure 1:
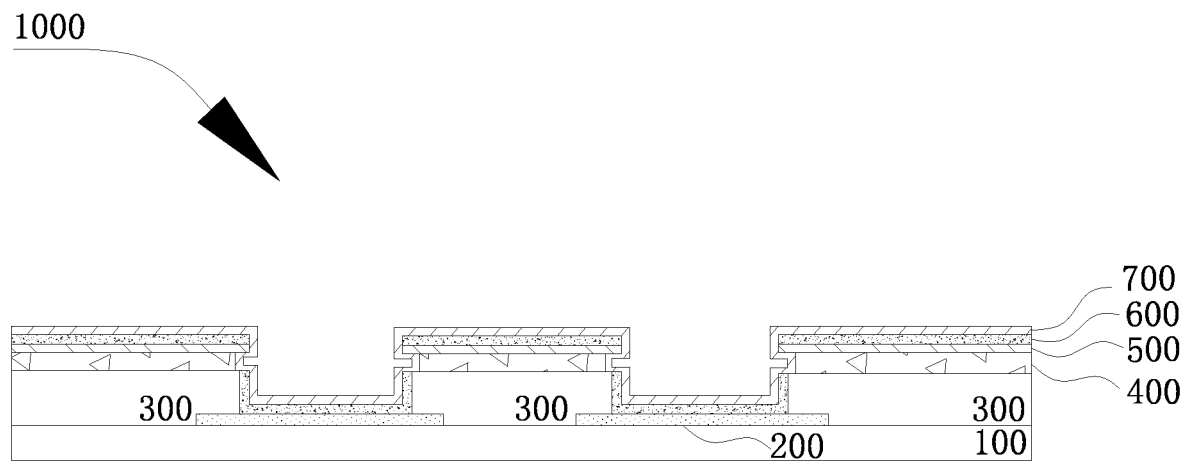
FIG. 1 shows a schematic structural diagram of an organic light emitting display panel according to one embodiment of the present disclosure.

1000: organic light emitting display panel; 100: substrate; 200: anode; 300: pixel definition layer; 400: metal layer; 500: anti-reflection layer; 600: light emitting layer; 700: cathode; 800: encapsulation structure; 910: black matrix; and 920: color resistance block.

DETAILED DESCRIPTION

The embodiments of the disclosure will be described below in detail. Examples of the embodiments are illustrated in the drawings and the same or similar reference signs always represent the same or similar components or components with the same or similar functions. The embodiments described below with reference to the drawings are exemplary and intended to explain the disclosure and should not be understood as limits to the disclosure.

In one aspect of the present application, with reference to FIG. 1, embodiments of the present disclosure provide an organic light emitting display panel 1000 which includes a substrate 100, on which a plurality of organic light emitting diodes 200 and 700 are arranged; a pixel definition layer (PDL) 300, which defines a plurality of sub-pixel regions on the substrate 100; a metal layer 400, which is located on one side of the pixel definition layer 300 away from the substrate 100; an anti-reflection layer 500, which is located on one side of the metal layer 400 away from the pixel definition layer 300, wherein the orthographic projection of the metal layer 400 on the substrate 100 is located within the range where the orthographic projection of the anti-reflection layer 500 on the substrate 100 is located; a light emitting layer 600, which is located on one side of the anti-reflection layer 500 away from the metal layer 400; and a cathode 700, which is located on one side of the light emitting layer 600 away from the anti-reflection layer 500, and the cathode 700 is connected to the metal layer 400 in a roundabout manner. Specifically, the anode 200 of the organic light emitting diode is located in the sub-pixel region, and the cathode 700 is the cathode of the organic light emitting diode. Thus, through the cooperation between the anti-reflection layer and the metal layer, the reflectivity of the overall structure of an OLED display panel is effectively reduced, and the uniformity of the display brightness in different regions of the display panel is effectively improved.

For conveniently understanding, the principle by which the organic light emitting display panel can achieve the above-mentioned beneficial advantageous effects will be briefly described as follows.

Figure 2:
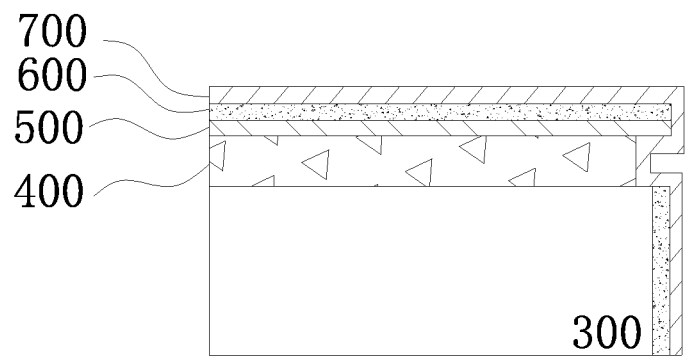
FIG. 2 shows a partial structural schematic view of an organic light emitting display panel according to one embodiment of the present disclosure.

The existing organic light emitting display panels have a high reflectivity of about 5.7%, which is relatively high so that reflection and glare easily appear. The reflectivity of the overall structure of the display panel should be reduced to less than 5% to meet the requirements of daily use. For the purpose of improving light transmittance of the organic light emitting display panel, it is generally necessary to reduce the thickness of the cathode of the organic light emitting diode so as to reduce the influence of the cathode on the light emission of the light emitting layer; and however, with the decreasing of the thickness of the cathode, the resistance of the cathode itself increases, so that the voltage applied across the organic light emitting diode generates a voltage drop due to the excessive resistance of the cathode, resulting in uneven brightness display in different regions of the display panel. Referring to FIG. 2, in the present disclosure, the metal layer 400 and the anti-reflection layer 500 are arranged on the pixel definition layer 300, and an inwardly retracted structure is provided for the metal layer 400. The material forming the anti-reflection layer 500 has a good anti-reflection property, for example, an optical interference cancellation effect exists between the anti-reflection layer 500 and the metal layer 400, that is the two optical wave gas phase cancellation amplitude is equal to zero. The reflectivity of the overall structure of the display panel is further reduced by cooperation between the metal layer 400 and the anti-reflection layer 500, and the occurrence of reflection and glare is reduced. Since the material forming the light emitting layer 600 has poor ductility, and the orthographic projection of the metal layer 400 on the substrate 100 is within the range of the orthographic projection of the anti-reflection layer 500 on the substrate 100, that is to say, the area of the metal layer 400 is smaller than that of the anti-reflection layer 500, the inwardly retracted structure is formed between the metal layer 400 and the anti-reflection layer 500. Then, when the light emitting layer 600 is formed on the entire surface of the substrate, a continuous film cannot be formed in the inwardly retracted structure, that is, the light emitting layer 600 is broken in the inwardly retracted structure of the metal layer 400. Thus, the side wall portion of the metal layer 400 is exposed to the outside, and then when the cathode 700 of the organic light emitting diode is subsequently formed on the whole surface of the substrate, since the material forming the cathode 700 has the certain ductility, the cathode 700 can form the continuous film layer in the inwardly retracted structure of the metal layer 400, that is, the cathode 700 is connected to the metal layer 400 in a roundabout manner, and the material forming the metal layer 400 is a metal material with better conductivity. By having the cathode and the metal layer connected therebetween in the roundabout manner, the better conductivity of the metal layer can be used to realize the function of an auxiliary cathode, thereby reducing cathode resistance, and further improving the stability of the voltage applied on the two ends of the organic light emitting diode and solving the problem of uneven brightness. In summary, the embodiments of the present disclosure, by arranging the metal layer and the anti-reflection layer on the pixel definition layer, the reflectivity of the overall structure of a display panel is effectively reduced by using the light interference cancellation effect between the metal layer and the anti-reflection layer, and the reflectivity is reduced smaller than 5%, the use requirements are met. The metal layer is used as the auxiliary cathode and the inwardly retracted structure is formed for the metal layer by adjusting etching conditions, so that the light emitting layer is disconnected, and then cathode depositing is completed to overlap the cathode and the metal layer, the cathode resistance is effectively reduced and the problem of uneven brightness is solved.

According to some embodiments of the present disclosure, the surface covered by the light emitting layer 600 is not particularly limited if the light emitting layer can cover the sub-pixel region and do not cover the inwardly retracted structure of the metal layer, which is helpful to improve the light emitting performance of the sub-pixel region and increase the contact area between the cathode and the metal layer, thereby reducing the cathode resistance. For example, the light emitting layer 600 can cover the surface of the anti-reflective layer 500, the sidewalls of the pixel defining layer, and the sub-pixel region.

According to some embodiments of the present disclosure, the refractive index of the material forming the anti-reflective layer 500 is not particularly limited, and the higher the refractive index of the material, the greater the ability to refract incident light. For example, the refractive index range of the material forming the anti-reflective layer 500 can between 2 and 3. When the refractive index of the material forming the anti-reflection layer is within the above range, the thickness of the formed anti-reflection layer 500 is moderate, and good interference cancellation between the anti-reflection layer 500 and the metal layer 400 can be achieved. In particular, the material forming the anti-reflective layer 500 can have a refractive index of about 2.5. According to some embodiments of the present disclosure, the extinction coefficient of the material forming the anti-reflection layer 500 is not particularly limited, for example, the extinction coefficient range of the material forming the anti-reflection layer 500 can between 0 and 1, when the extinction coefficient of the material forming the anti-reflection layer lies within the above range, the thickness of the formed anti-reflection layer 500 is moderate, then the better optical interference cancellation between the anti-reflection layer 500 and the metal layer 400 can be realized. In particular, the extinction coefficient of the material forming the anti-reflective layer 500 can be about 0.5.

According to some embodiments of the present disclosure, the material forming the metal layer 400 is not particularly limited, for example, the material forming the metal layer 400 can be the metal. The material forming the metal layer 400 should have good electrical conductivity and the optical interference cancellation exists between the metal layer 400 and the anti-reflection layer 500. A person skilled in the art would have been able to select materials according to actual situations.

According to some embodiments of the present disclosure, the material forming the metal layer 400 is not particularly limited, for example, the material forming the metal layer 400 can be molybdenum or aluminum. According to some embodiments of the present disclosure, the material forming the anti-reflective layer 500 is not particularly limited, for example, the material forming the anti-reflective layer 500 can be at least one of molybdenum oxide, niobium oxide, and copper oxide. Thus, the display effect of the panel can be further improved by using the better anti-reflection property of the anti-reflection layer 500 material.

According to some embodiments of the present disclosure, there should be a distance between the edge of the orthographic projection of the metal layer 400 on the substrate 100 and the edge of the orthographic projection of the anti-reflective layer 500 on the substrate 100 due to the presence of the inwardly retracted structure, the minimum of the distance is not particularly limited, for example, the minimum distance between the edge of the orthographic projection of the metal layer 400 on the substrate 100 and the edge of the orthographic projection of the anti-reflective layer 500 on the substrate 100 can range from 0.5 to 1.5 micrometers. When the minimum distance between the edge of the orthographic projection of the metal layer 400 on the substrate 100 and the edge of the orthographic projection of the anti-reflection layer 500 on the substrate 100 is less than 0.5 micrometer, the retracted distance of the inwardly retracted structure of the metal layer 400 is insufficient, and the light emitting layer 600 cannot form a break at the inwardly retracted structure of the metal layer 400, resulting in that the cathode 700 cannot be connected to the metal layer 400 in the roundabout manner to reduce the resistance of the cathode 700. When the minimum distance between the edge of the orthographic projection of the metal layer 400 on the substrate 100 and the edge of the orthographic projection of the anti-reflection layer 500 on the substrate 100 is greater than 1.5 micrometers, the retraction distance of the inwardly retracted structure of the metal layer 400 is too large, the ductility of the material of the cathode 700 is not sufficient to satisfy the excessively long extension distance of the cathode 700, and the cathode 700 is broken at the inwardly retracted structure of the metal layer 400, so that the connecting between the cathode 700 and the metal layer 400 in the roundabout manner cannot be realized. In particular, the minimum distance between the edge of the orthographic projection of the metal layer 400 on the substrate 100 and the edge of the orthographic projection of the anti-reflection layer 500 on the substrate 100 can be about 1 micrometer.

Figure 3:
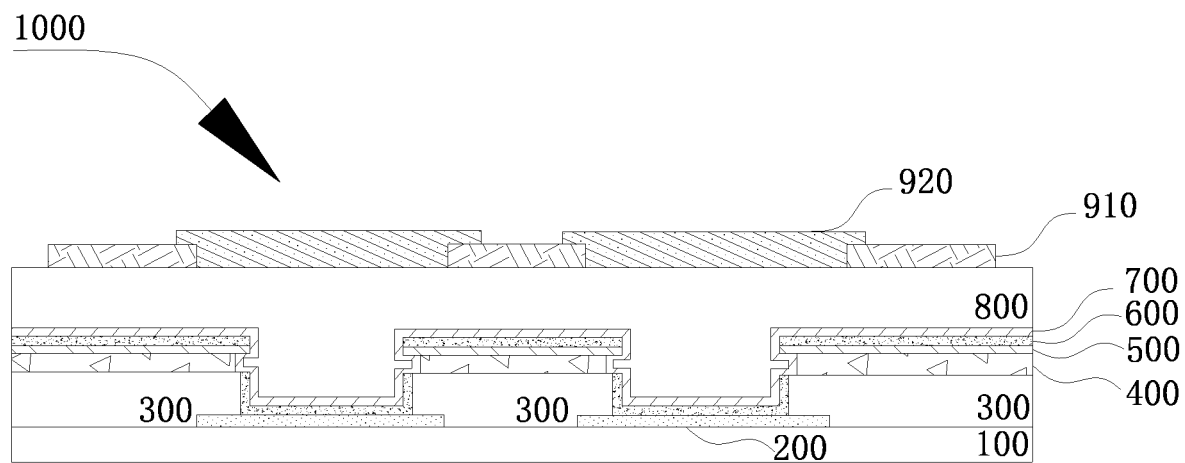
FIG. 3 shows a schematic structural diagram of an organic light emitting display panel according to another embodiment of the present disclosure.

According to some embodiments of the present disclosure, with reference to FIG. 3, the organic light emitting display panel 1000 can further include an encapsulation structure 800 and color resistance structures 910 and 920. And the color resistance structures are located on one side of the encapsulation structure away from the substrate 100, the color resistance structure includes a black matrix 910 and a color resistance block 920. The inner structure of the display panel is protected from being damaged by external water and oxygen by the provision of the encapsulation structure, thereby causing a light emission defect of the display panel. Circuit wires inside the display panel are hidden by the arrangement of the black matrix. The light emitted from the light emitting layer 600 is filtered to display a desired monochromatic light by the arrangement of the color block 920.

In addition, although both sides of the metal layer 400 have the inwardly retracted structure as shown in FIGS. 1 and 3, it will be understood by those skilled in the art that a single side of the metal layer 400 can have the inwardly retracted structure. For example, only the left side of the metal layer 400 has the inwardly retracted structure, or only the right side of the metal layer 400 has the inwardly retracted structure, or both the left and right sides of the metal layer 400 have the inwardly retracted structure respectively.

In addition, although the inwardly retracted structure of the metal layer 400 is an internal core pulling rectangular shape as shown in FIGS. 1 and 3, it will be understood by those skilled in the art that the internal core pulling shape can also be a circular or elliptical shape. Optionally, the internal core pulling rectangular shape has a chamfered shape at both corners of the outside.

In addition, as shown in FIGS. 1 and 3, the cathode 700 is connected to the metal layer 400 in a roundabout manner. Here, the cathode 700 is connected to the metal layer 400 in a roundabout manner means that the cathode 700 extends in a direction (Y-direction) substantially perpendicular to the direction in which the substrate 100 extends, and a direction (X-direction) substantially parallel to the direction in which the substrate 100 extends so as to contact with the metal layer 400.

In another aspect of the present disclosure, the present disclosure proposes the method for manufacturing the organic light emitting display panel described previously, which further improves the display effect of the organic light emitting display panel by arranging the anti-reflection layer and the metal layer.

Figure 4:
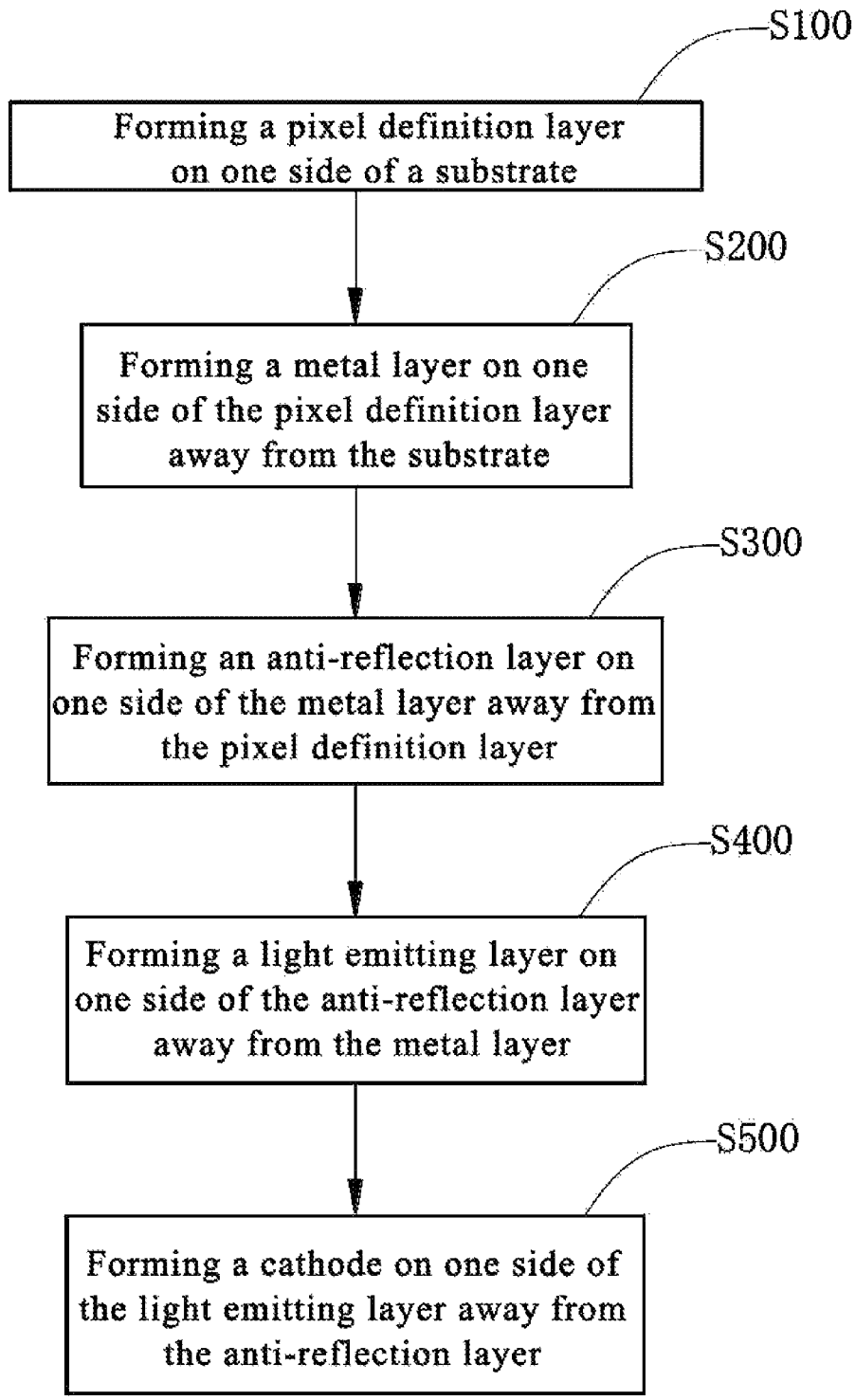
FIG. 4 shows a schematic flow chart for manufacturing an organic light emitting display panel according to the present disclosure.

Specifically, referring to FIG. 1, FIG. 3, and FIG. 4, the method for manufacturing the organic light emitting display panel includes the following steps:

S100: forming the pixel definition layer 300 on one side of the substrate 100;

according to some embodiments of the present disclosure, in S100, the pixel definition layer 300 is formed on one side of the substrate 100, the pixel definition layer 300 defines a plurality of sub-pixel regions on the substrate 100, which is helpful to improve the process accuracy for forming the sub-pixels.

S200: forming the metal layer 400 on one side of the pixel definition layer 300 away from the substrate 100;

according to some embodiments of the present disclosure, in S200, the metal layer 400 is formed on one side of the pixel definition layer 300 away from the substrate 100, and the material forming the metal layer 400 has better electrical conductivity, and after the metal layer 400 is connected to the cathode 700 in a roundabout manner, it is helpful to reduce the cathode resistance and improve the uniformity of the display brightness in different regions of the display panel.

S300: forming the anti-reflection layer 500 on one side of the metal layer 400 away from the pixel definition layer 300;

according to some embodiments of the present disclosure, in S300, the anti-reflection layer 500 is formed on one side of the metal layer 400 away from the pixel definition layer 300, the material forming the anti-reflection layer 500 has a better anti-reflection performance, the light interference cancellation exist between the anti-reflection layer 500 and the metal layer 400, and the reflectivity of the overall structure of the display panel is further reduced by the cooperation between the anti-reflection layer 500 and the metal layer 400, and the occurrence of phenomena such as reflection and glare of the display panel are effectively reduced.

S400: forming the light emitting layer 600 on one side of the anti-reflection layer 500 away from the metal layer 400;

according to some embodiments of the present disclosure, in S400, the light emitting layer 600 is formed on one side of the anti-reflection layer 500 away from the metal layer 400. And the light emitting layer 600 includes light emitting film layers (not shown) such as an electron injection layer, an electron transport layer, an organic light emitting layer, and a hole transport layer; under the drive of an external voltage, electrons and holes injected from an electrode enter the organic light emitting layer through the electron transport layer and the hole transport layer respectively, and an electron-hole pair in a bound energy level this is an exciton is recombined in the organic light emitting layer; and the exciton radiation de-excites and emits photons to generate visible light.

S500: forming the cathode 700 on one side of the light emitting layer 600 away from the anti-reflection layer 500.

According to some embodiments of the present disclosure, in S500, the cathode 700 is formed on one side of the light emitting layer 600 away from the anti-reflective layer 500, and when the voltage is applied on two ends of the light emitting layer 600, the electrons are injected from the cathode 700 into the hole injection layer and enter the organic light emitting layer via the hole transport layer.

In order to enable the cathode 700 to be connected to the metal layer 400 in the roundabout manner and thereby reducing the cathode resistance, the light emitting layer 600 can be caused to form a break on the metal layer 400. The metal layer 400 can be etched after the anti-reflection layer 500 is formed, so that the inwardly retracted structure is formed in the metal layer 400. When the light emitting layer 600 is formed on one side of the anti-reflection layer 500 away from the metal layer 400, the material of the light emitting layer 600 may break at the inwardly retracted structure of the metal layer 400 due to insufficient ductility. And when the cathode 700 is formed on one side of the light emitting layer 600 away from the anti-reflection layer 500, the cathode material may form the continuous film layer at the inwardly retracted structure of the metal layer 400 due to better ductility, so as to realize the overlapping between the cathode 700 and the metal layer 400.

According to some embodiments of the present disclosure, after forming the anti-reflective layer 500, the method further includes: after the anti-reflective layer 500 is formed, the metal layer 400 is etched with the etching gas such that the orthographic projection of the metal layer 400 on the substrate 100 is within the range of the orthographic projection of the anti-reflective layer 500 on the substrate 100.

According to one embodiment of the present disclosure, the choice of etching gas is not particularly limited, for example, when the material forming the metal layer is aluminum, the etching gas may be chlorine gas. According to another embodiment of the present disclosure, when the material forming the metal layer is molybdenum, the etching gas may be sulfur hexafluoride and oxygen.

In another aspect of the present disclosure, the present disclosure provides a display device which includes the above-described organic light emitting display panel, whereby the display device has all the features and advantages of the above-described organic light emitting display panel and will not be described in detail herein.

The schemes of the present application are illustrated by the following specific examples, it should be noted that the following examples are illustrative only and should not be taken as limiting the scope of the application. For specific techniques or conditions which are not specified in the embodiments, they are performed according to techniques or conditions described in the references in the art or according to product specifications. The reagents or instruments used are conventional products that can be obtained commercially without specifying the manufacturer.

Embodiment 1

1. The pixel definition layer and the anode are formed on one side of the substrate.
2. The metal layer is formed on one side of the pixel definition layer away from the substrate, and the material forming the metal layer is molybdenum.
3. The anti-reflection layer is formed on one side of the metal layer away from the pixel definition layer, and the material forming the anti-reflection layer is niobium oxide.
4. The substrate including the pixel definition layer, the metal layer, and the anti-reflection layer is etched with sulfur hexafluoride and oxygen, so that the metal layer has the inwardly retracted structure.
4. The light emitting layer is formed on one side of the anti-reflection layer away from the metal layer, the light emitting layer breaks at the inwardly retracted structure in the metal layer.
5. The cathode is formed on one side of the light emitting layer away from the anti-reflection layer, the cathode is connected to the metal layer in a roundabout manner at the inwardly retracted structure in the metal layer.
6. The conventional packaging structure and the color resistance structure are arranged on the substrate.

The results show that: the reflectivity of the overall structure of the display panel is about 4%, phenomena such as reflection and glare does not occur. The brightness uniformity of different regions of the display panel is better.

Comparative Embodiment 1

1. The pixel definition layer and the anode are formed on one side of the substrate.
2. The light emitting layer is formed on one side of the pixel definition layer away from the substrate.
3. The cathode is formed on one side of the light emitting layer away from the pixel definition layer.
4. The conventional packaging structure and the color resistance structure are arranged on the substrate.

The results show that: the refractive index of the overall structure of the display panel is about 5.7%, and the phenomena of reflection and glare occur. The brightness uniformity of different regions of the display panel is relatively poor.

In the description of the present disclosure, the terms "upper", "lower", and the like are based on the orientation or positional relationship shown in the drawings, and is merely for convenience of describing the disclosure and simplifying the description, but not be construed as limiting the present disclosure.

In the descriptions of the specification, the descriptions made with reference to terms "an embodiment", "another embodiment" or the like refer to that specific features, structures, materials, or characteristics described in combination with the embodiment or the example are included in at least one embodiment or example of the application. In the specification, these terms are not always schematically expressed for the same embodiment or example. Moreover, the specific described features, structures, materials or characteristics may be combined in a proper manner in any one or more embodiments or examples. In addition, those skilled in the art may integrate and combine different embodiments or examples described in the specification and features of different embodiments or examples without conflicts. The terms "first" and "second" are used for descriptive purposes only and are not to be construed as indicating or implying relative importance or implicitly indicating the number of technical features indicated.

The embodiments of the application have been shown or described above. However, it can be understood that the previous described embodiments are exemplary and should not be understood as limits to the application and those of ordinary skill in the art may make variations, modifications, replacements, transformations to the previously described embodiments within the scope of the application.

What is claimed is:

1. An organic light emitting display panel, comprising:
    a substrate having one or more organic light emitting diodes (OLED) thereon;
    a pixel definition layer (PDL), wherein the pixel definition layer defines one or more sub-pixel regions on the substrate;
    a metal layer, wherein the metal layer is located on one side of the pixel definition layer away from the substrate;
    an anti-reflection layer, wherein the anti-reflection layer is located on one side of the metal layer away from the pixel definition layer, and the orthographic projection of the metal layer on the substrate is located within the range where the orthographic projection of the anti-reflection layer on the substrate is located;
    a light emitting layer, wherein the light emitting layer is located on one side of the anti-reflection layer away from the metal layer, wherein the light emitting layer covers a surface of the anti-reflection layer, a sidewall of the pixel definition layer, and the sub-pixel regions; and
    a cathode, wherein the cathode is located on one side of the light emitting layer away from the anti-reflection layer, and the cathode is connected to the metal layer in a roundabout manner,
    wherein an area of the metal layer is smaller than that of the anti-reflection layer;
    an inwardly retracted structure is formed between the metal layer and the anti-reflection layer; and
    the cathode forms a continuous film layer in the inwardly retracted structure between the metal layer and the anti-reflection layer, and the cathode is connected to the metal layer in the roundabout manner;
    wherein the light emitting layer is discontinuous in the inwardly retracted structure of the metal layer;
    wherein the cathode is connected to the light emitting layer covering the sidewall of the pixel definition layer and the anti-reflection layer in the inwardly retracted structure of the metal layer.

2. The organic light emitting display panel according to claim 1, wherein a material of the anti-reflection layer has a refractive index of 2 to 3, and the material of the anti-reflection layer has an extinction coefficient of 0 to 1.

3. The organic light emitting display panel according to claim 2, wherein the material of the metal layer is metal.

4. The organic light emitting display panel according to claim 3, wherein the material of the metal layer comprises at least one of molybdenum and aluminum.

5. The organic light emitting display panel according to claim 2, wherein the refractive index of the material of the anti-reflection layer is about 2.5, and the extinction coefficient of the material of the anti-reflection layer is about 0.5.

6. The organic light emitting display panel according to claim 2, wherein the material of the anti-reflection layer comprises at least one of molybdenum oxide, niobium oxide, and copper oxide.

7. The organic light emitting display panel according to claim 1, wherein the metal layer has an inwardly retracted structure on both sides in a direction substantially parallel to an extending direction of the substrate.

8. The organic light emitting display panel according to claim 7, wherein the inwardly retracted structure of the metal layer is a collapsed rectangular shape.

9. The organic light emitting display panel according to claim 1, wherein a minimum distance between an edge of the orthographic projection of the metal layer on the substrate and an edge of the orthographic projection of the anti-reflection layer on the substrate is between 0.5 and 1.5 micrometers.

10. The organic light emitting display panel according to claim 9, wherein a minimum distance between an edge of the orthographic projection of the metal layer on the substrate and an edge of the orthographic projection of the anti-reflection layer on the substrate is about 1 micrometer.

11. The organic light emitting display panel according to claim 1, wherein the organic light emitting display panel further comprises an encapsulation structure and a color resistance structure which is located on a side of the encapsulation structure away from the substrate.

12. The organic light emitting display panel according to claim 11, wherein the color resistance structure comprises a black matrix and a color resistance block.

13. The organic light emitting display panel according to claim 1, wherein the cathode is connected to the metal layer in a roundabout manner refers to that the cathode extends in a direction substantially perpendicular to the direction in which the substrate extends and a direction substantially parallel to the direction in which the substrate extends so as to be in contact with the metal layer.

14. The organic light emitting display panel according to claim 1, wherein the metal layer has an inwardly retracted structure at only one side of a direction substantially parallel to an extending direction of the substrate.

15. A method for manufacturing an organic light emitting display panel, comprising:
    forming a pixel definition layer (PDL) on one side of a substrate;
    forming a metal layer on one side of the pixel definition layer away from the substrate;
    forming an anti-reflection layer on one side of the metal layer away from the pixel definition layer;
    forming an inwardly retracted structure between the metal layer and the anti-reflection layer;
    forming a light emitting layer on one side of the anti-reflection layer away from the metal layer, wherein the light emitting layer covers a surface of the anti-reflection layer, a sidewall of the pixel definition layer, and the sub-pixel regions; and
    forming a cathode on one side of the light emitting layer away from the anti-reflection layer; and
    forming by the cathode a continuous film layer in the inwardly retracted structure between the metal layer and the anti-reflection layer, and the cathode is connected to the metal layer in a roundabout manner,
    wherein the cathode is located on one side of the light emitting layer away from the anti-reflection layer,
    wherein an area of the metal layer is smaller than that of the anti-reflection layer;
    wherein the light emitting layer is discontinuous in the inwardly retracted structure of the metal layer;
    wherein the cathode is connected to the light emitting layer covering the sidewall of the pixel definition layer and the anti-reflection layer in the inwardly retracted structure of the metal layer.

16. The method according to claim 15, further comprising:
    etching the metal layer with an etching gas after forming the anti-reflection layer so that the orthographic projection of the metal layer on the substrate is within the range of the orthographic projection of the anti-reflection layer on the substrate.

17. The method according to claim 16, wherein when the material of the metal layer is aluminum, the etching gas is chlorine gas.

18. The method according to claim 16, wherein when the material of the metal layer is molybdenum, the etching gas is sulfur hexafluoride and oxygen.

19. A display device, comprising an organic light emitting display panel,
    the organic light emitting display panel comprising:
    a substrate having one or more organic light emitting diodes thereon;
    a pixel definition layer, wherein the pixel definition layer defines one or more sub-pixel regions on the substrate;
    a metal layer, wherein the metal layer is located on one side of the pixel definition layer away from the substrate, wherein the light emitting layer covers a surface of the anti-reflection layer, a sidewall of the pixel definition layer, and the sub-pixel regions;
    an anti-reflection layer, wherein the anti-reflection layer is located on one side of the metal layer away from the pixel definition layer, and the orthographic projection of the metal layer on the substrate is located within the range where the orthographic projection of the anti-reflection layer on the substrate is located;
    a light emitting layer, wherein the light emitting layer is located on one side of the anti-reflection layer away from the metal layer; and
    a cathode, wherein the cathode is located on one side of the light emitting layer away from the anti-reflection layer, and the cathode is connected to the metal layer in a roundabout manner,
    wherein an area of the metal layer is smaller than that of the anti-reflection layer;
    an inwardly retracted structure is formed between the metal layer and the anti-reflection layer; and
    the cathode forms a continuous film layer in the inwardly retracted structure between the metal layer and the anti-reflection layer, and the cathode is connected to the metal layer in the roundabout manner;
    wherein the light emitting layer is discontinuous in the inwardly retracted structure of the metal layer;

wherein the cathode is connected to the light emitting layer covering the sidewall of the pixel definition layer and the anti-reflection layer in the inwardly retracted structure of the metal layer.

* * * * *